United States Patent [19]

Ogawa

[11] Patent Number: 5,099,295
[45] Date of Patent: Mar. 24, 1992

[54] COMPOUND SEMICONDUCTOR DEVICE WHICH UTILIZES AN ELECTRON SUPPLY LAYER WHICH HAS A GRADED COMPOSITION SO THAT A CONSTITUENT VARIES IN PERCENTAGE COMPOSITION FROM ONE SIDE TO THE OTHER

[75] Inventor: Masamichi Ogawa, Kanagawa, Japan
[73] Assignee: Sony Corporation, Tokyo, Japan
[21] Appl. No.: 468,357
[22] Filed: Jan. 22, 1990

[30] Foreign Application Priority Data

Jan. 31, 1989 [JP] Japan .................................. 1-022095

[51] Int. Cl.$^5$ .......................................... H01L 29/161
[52] U.S. Cl. .......................................... 357/16; 357/22
[58] Field of Search ................... 357/22 MD, 22 A, 16

[56] References Cited

U.S. PATENT DOCUMENTS

| | | | |
|---|---|---|---|
| 4,740,822 | 4/1988 | Itoh | 357/22 A |
| 4,827,320 | 5/1989 | Morkoc et al. | 357/22 A |

FOREIGN PATENT DOCUMENTS 1-143270 9/1989 Japan .

OTHER PUBLICATIONS

Okamoto et al., "Strained N-$Ga_{0.7}Al_{0.3}As/In_xGa_{1-x}As$/GaAs Modulation-Doped Structure," Japanese Journal of Applied Physics, vol. 26 No. 4, Apr. 1987, pp. 539-542.

Henderson et al., "Characterization of Pseudomorphic InGaAs/AlGaAs MODFET Structures Grown by Molecular Beam Epitaxy," IEDM, Dec. 1987, pp. 418-421.

Primary Examiner—Andrew J. James
Assistant Examiner—Courtney A. Bowers
Attorney, Agent, or Firm—Hill, Van Santen, Steadman & Simpson

[57] ABSTRACT

A compound semiconductor device having a channel layer and an electron supply layer and using a two-dimensional electron gas. The channel layer near the interface between the channel layer and the electron supply layer is formed as a graded layer. It is possible to realize a compound semiconductor device which has good characteristics and which can be easily fabricated.

1 Claim, 3 Drawing Sheets

COMPOUND SEMICONDUCTOR DEVICE WHICH UTILIZES AN ELECTRON SUPPLY LAYER WHICH HAS A GRADED COMPOSITION SO THAT A CONSTITUENT VARIES IN PERCENTAGE COMPOSITION FROM ONE SIDE TO THE OTHER

BACKGROUND OF THE INVENTION

1. Field of the Invention

The present invention relates to a compound semiconductor device and, more particularly, to a compound semiconductor device using a two-dimensional electron gas.

2. Description of the Prior Art

Hitherto, as a compound semiconductor device using a two-dimensional electron gas (2DEG), a high electron mobility transistor (HEMT) has been known. In the HEMT, the 2DEG which is formed in the channel layer near the heterointerface between the channel layer and the electron supply layer is used as a channel. An n-type AlGaAs/GaAs HEMT using an n-type AlGaAs layer and an undoped GaAs layer as an electron supply layer and a channel layer, respectively has been most well-known.

In recent years, in the n-type AlGaAs/GaAs HEMT, there has been proposed a method whereby the energy difference $\Delta E_c$ of the conduction band edge ($E_c$) at the n-type AlGaAs/GaAs heterointerface is increased by introducing an InGaAs layer of constant compositions whose electron affinity is larger than that of GaAs between the n-type AlGaAs layer and the GaAs layer, thereby increasing the 2DEG concentration $n_s$. In this case, since the InGaAs lattice constant is larger than that of GaAs, the InGaAs layer is lattice-mismatched to the GaAs layer. Thus, a lattice distortion occurs in the InGaAs layer. For this reason, the InGaAs layer is called a pseudomorphic (or strained) layer. When the thickness of InGaAs layer is set to a value called the critical layer thickness which is determined by the composition of this layer or more, misfit dislocations occur at the interface between the InGaAs layer and the GaAs layer. Therefore, to suppress the occurrence of such misfit dislocations, it is necessary to set the thickness of InGaAs layer to the critical layer thickness or less.

To improve the characteristics of the HEMT, it is necessary to increase the 2DEG concentration $n_s$ and the saturation velocity $v_s$ of electrons. In the case where the InGaAs layer having constant compositions is used as a pseudomorphic layer as mentioned above, it is advantageous because as the In composition is large, the 2DEG concentration $n_s$ and the saturation velocity $v_s$ increase. However, there are the following problems (Jpn. J. Appl. Phys. 26 (1987) 539).

(1) As the In composition is large, the critical layer thickness decreases. For instance, it has been known that when the In composition is set to 20%, the critical layer thickness is 200 Å or less.

(2) When the thickness of InGaAs layer reaches a value (<200 Å) such as to cause the quantum effect as the result of that the thickness of InGaAs layer was set to a value which is equal to or less than the critical layer thickness, energy levels rise. Thus, even if the In composition increases, the 2DEG concentration $n_s$ is not increased remarkably.

Therefore, in the conventional n-type AlGaAs/InGaAs/GaAs HEMT using the InGaAs layer as a pseudomorphic layer, when the 2DEG concentration $n_s$ is intended to be maximized, the In composition of the InGaAs layer is determined to a value within a range from 15 to 20% and the thickness is determined to a value within a range from 200 to 150 Å. Therefore, degrees of freedom in selection of the In composition and the InGaAs thickness are small. On the other hand, in the n-type AlGaAs/InGaAs/GaAs HEMT, electrons are confined to the quantum well formed by the double heterojunctions comprising the n-type AlGaAs/InGaAs heterojunction and the InGaAs/GaAs heterojunction and thereby the 2DEG is formed. Therefore, in the case where defects such as alloy clusters or the like and other scatterer exist in the double heterojunctions, the characteristics of the HEMT can be easily deteriorated due to influences by them.

Further, when the HEMT is fabricated by molecular beam epitaxy (MBE), the growth temperature of the InGaAs layer needs to be set to be lower than the growth temperature of the GaAs layer or the AlGaAs layer by about 100° C. For this purpose, for instance, after the GaAs layer was grown, it is necessary to immediately lower the growth temperature by about 100° C. and to grow the InGaAs layer. However, it is not so easy to suddenly change the growth temperature with good controllability. If the controllability of the growth temperature is bad, there is a fear such that alloy clusters or the like are formed at the heterointerfaces of the double heterojunctions and characteristics of the HEMT deteriorate. Therefore, to prevent such a problem, enough attention must be paid to the control of the growth temperature. On the other hand, since the thickness of InGaAs layer is so small to be 200 to 150 Å as mentioned above, it is not so easy to grow the InGaAs layer with good controllability of the thickness.

OBJECTS AND SUMMARY OF THE INVENTION

It is, therefore, an object of the present invention to provide a compound semiconductor device which has good characteristics and which can be easily fabricated.

In accordance with the present invention, there is provided a compound semiconductor device having a channel layer and an electron supply layer and using a two-dimensional electron gas, the channel layer near the interface between the channel layer and the electron supply layer is formed as a graded layer.

The graded layer denotes a layer whose compositions continuously change. At the interface between the graded layer and the channel layer, the graded layer has the same compositions as those of the channel layer. The compositions of the graded layer continuously change such that $\Delta E_c$ increases toward the electron supply layer. The graded layer constructs a pseudomorphic layer.

Since the channel layer near the interface between the channel layer and the electron supply layer is formed as a graded layer, by using the graded layer as a pseudomorphic layer, the critical layer thickness of the pseudomorphic layer is larger than that in the case of using the pseudomorphic layer having constant compositions as in the conventional device. Therefore, the thickness of the pseudomorphic layer can be increased as compared with the conventional pseudomorphic layer of constant compositions. Thus, for instance, in the case of growing the pseudomorphic layer by MBE, the thickness can be easily controlled. On the other hand, in the case of growing the pseudomorphic layer the growth temperature does not need to be suddenly changed. Further, the degree of freedom in changing the energy band shape can be obtained. In addition, since only the single heterojunction of the electron supply layer and the graded layer exists in the compound semiconductor device, the influences by the alloy clusters and the like as in the conventional HEMT having the double heterojunctions are hardly exerted. Thus, the deterioration in characteristics of the compound semiconductor device due to such influences also hardly occurs.

The above, and other, objects, features and advantages of the present invention will become readily apparent from the following detailed description thereof which is to be read in connection with the accompanying drawings.

DETAILED DESCRIPTION OF THE PREFERRED EMBODIMENTS

An embodiment of the present invention will be described hereinbelow with reference to the drawings. The embodiment relates to an embodiment in the case where the invention is applied to an n-type AlGaAs/InGaAs/GaAs HEMT using an InGaAs layer as a pseudomorphic layer.

Figure 1:
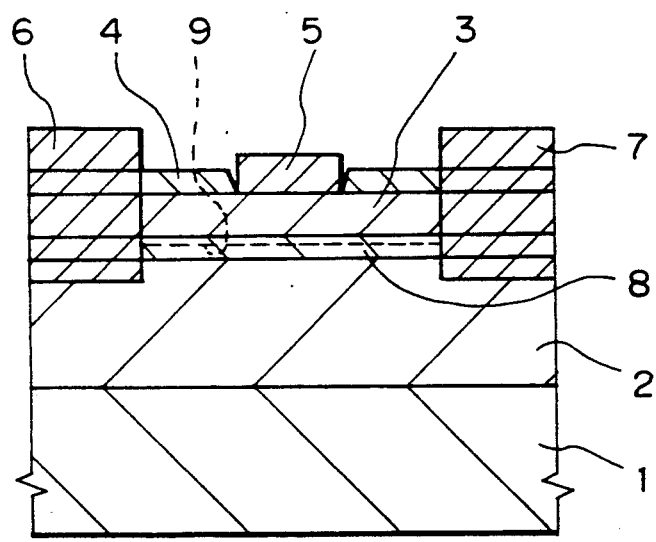
FIG. 1 is a cross sectional view showing an n-type AlGaAs/InGaAs/GaAs HEMT according to an embodiment of the present invention.

As shown in FIG. 1, in the HEMT according to the embodiment, an undoped GaAs layer 2 constructing a channel layer, an n-type AlGaAs layer (for instance, n-type $Al_{0.3}Ga_{0.7}As$ layer) 3 constructing an electron supply layer, and an n-type GaAs layer 4 constructing a cap layer are sequentially formed on a semi-insulating GaAs substrate 1. The thickness of n-type AlGaAs layer 3 is set to, for example, about 450 Å. The Schottky gate electrode 5 is formed on the n-type AlGaAs layer 3. Reference numerals 6 and 7 denote the source electrode and the drain electrode, respectively.

Figure 3:
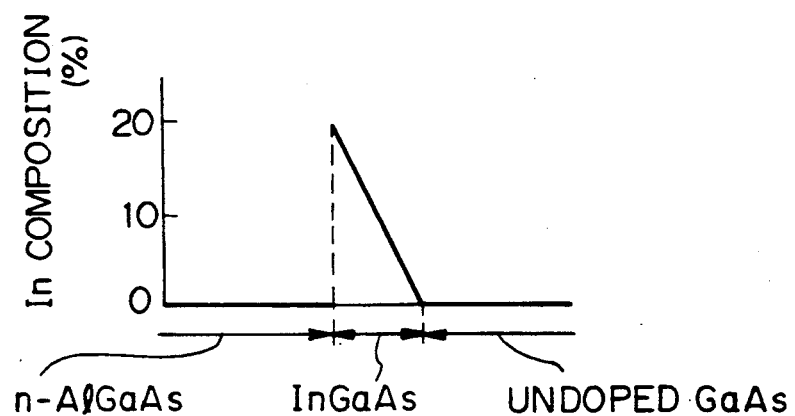
FIG. 3 is a graph showing the In composition distribution of the InGaAs layer in the HEMT shown in FIG. 1.

In the embodiment, an InGaAs layer 8 is formed between the undoped GaAs layer 2 and the n-type AlGaAs layer 3. The thickness of InGaAs layer 8 is set to, e.g., about 300 Å. As shown in FIG. 3, the In composition of the InGaAs layer 8 linearly continuously changes from the undoped GaAs layer 2 toward the n-type AlGaAs layer 3 from 0 to, for instance, 20%. Reference numeral 9 denotes a 2DEG. The 2DEG 9 is formed in the InGaAs layer 8 near the heterointerface between the n-type AlGaAs layer 3 and the InGaAs layer 8.

An example of a method of fabricating the HEMT according to the embodiment constructed as mentioned above will now be described.

As shown in FIG. 1, the undoped GaAs layer 2 is first grown on the semi-insulating GaAs substrate 1 by, for instance, MBE. The InGaAs layer 8 is subsequently grown on the undoped GaAs layer 2. In this case, in order to form the InGaAs layer 8 as a graded layer, the temperature of, for instance, a Knudsen cell constructing the molecular beam source of In is, for instance, linearly gradually raised during the growth. When the InGaAs layer 8 is grown to a desired thickness, the In composition is set to, e.g., 20%. Due to this, the InGaAs layer 8 having the In composition distribution as shown in FIG. 3 is grown. In the case of growing the InGaAs layer 8 after the undoped GaAs layer 2 was grown, the decreasing rate of the growth temperature is made slower than that in the case of using the InGaAs layer having constant In composition as in the conventional device. After the Si-doped n-type AlGaAs layer 3 was subsequently grown on the InGaAs layer 8 by MBE, the n-type GaAs layer 4 is grown on the n-type AlGaAs layer 3. Next, an ohmic metal film is formed on the n-type GaAs layer 4 by, for example, evaporation process. After the ohmic metal film was patterned into a predetermined shape, it is thermally treated, thereby alloying the ohmic metal film with the n-type GaAs layer 4, the n-type AlGaAs layer 3, the InGaAs layer 8, and the undoped GaAs layer 2 to form the source electrode 6 and the drain electrode 7. Then the n-type AlGaAs layer 3 is partially exposed by recess etching. Thereafter, the Schottky gate electrode 5 is formed on the exposed n-type AlGaAs layer 3, thereby completing the HEMT.

The Schottky gate electrode 5 may be formed prior to the source electrode 6 and the drain electrode 7.

Figure 2:
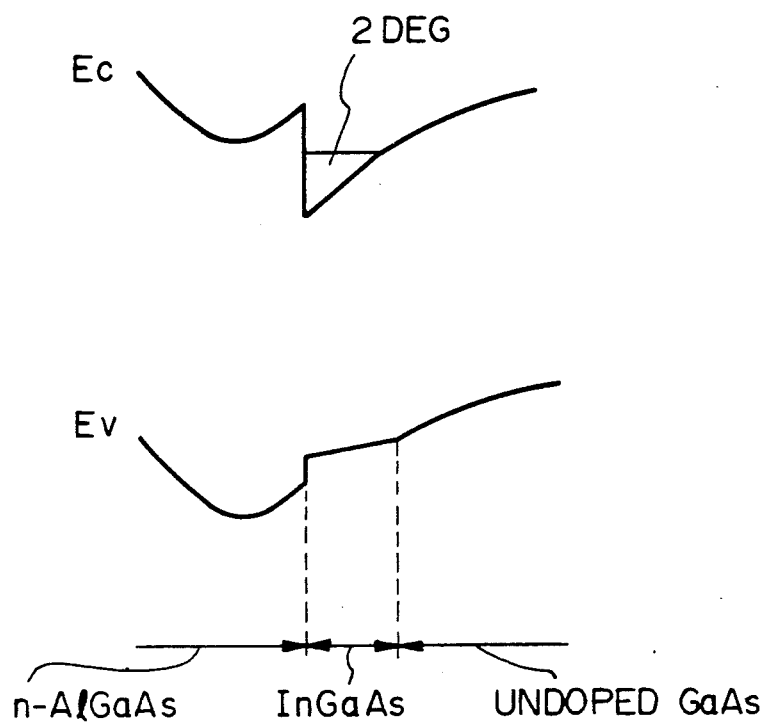
FIG. 2 is an energy band diagram showing the energy band structure of the HEMT shown in FIG. 1.

FIG. 2 shows the energy band structure of the HEMT according to the embodiment. In FIG. 2 Ev indicates the valence band edge. As shown in FIG. 2, in the HEMT, an inverse triangular deep quantum well is formed in the InGaAs layer 8 near the heterointerface between the n-type AlGaAs layer 3 and the InGaAs layer 8 and the 2DEG 9 is formed in the quantum well. In this case, at the interface of the InGaAs layer 8 and the undoped GaAs layer 2, the In composition is set to 0%. That is, at the interface of the InGaAs layer 8 and the undoped GaAs layer 2, the InGaAs layer 8 is actually the GaAs layer. Therefore, the energy band of the InGaAs layer 8 is continuous with the energy band of the undoped GaAs layer 2.

Figure 4:
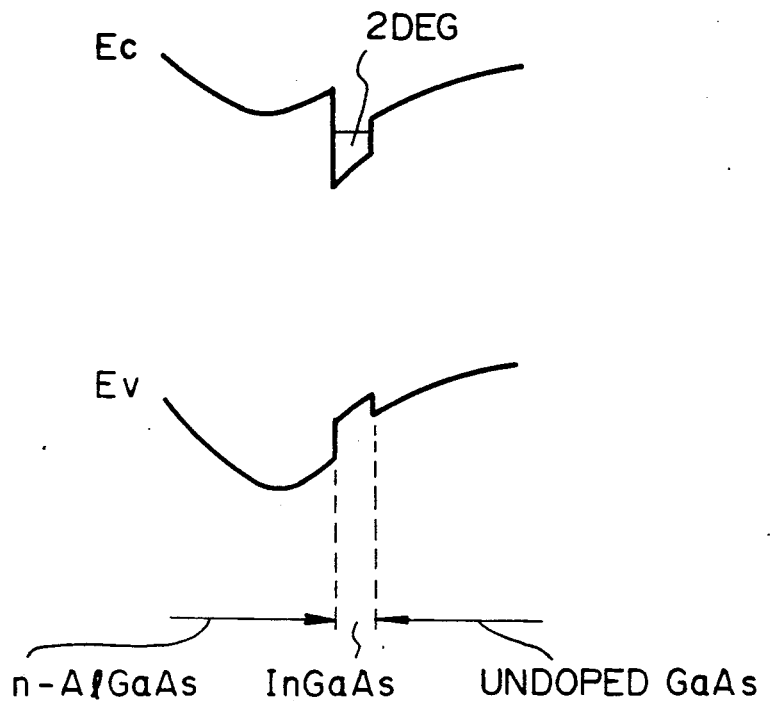
FIG. 4 is an energy band diagram showing the energy band structure of a conventional n-type AlGaAs/InGaAs/GaAs HEMT in which an InGaAs layer having a constant In composition is used as a pseudomorphic layer.
Figure 5:
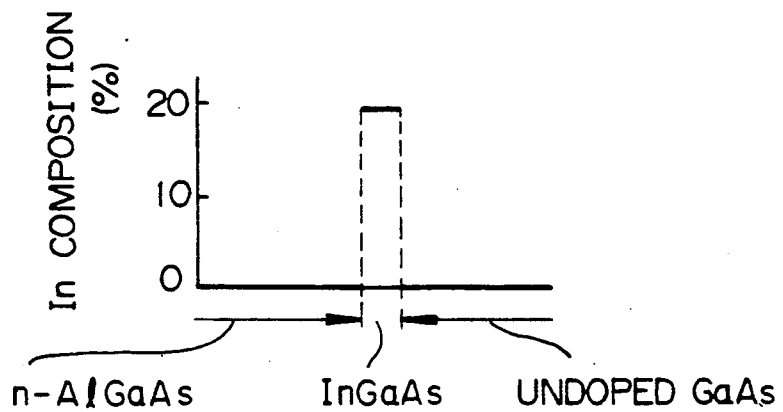
FIG. 5 is a graph showing the In composition distribution of the InGaAs layer in the HEMT shown in FIG. 4.

On the other hand, for comparison, the energy band structure of a conventional n-type AlGaAs/InGaAs/GaAs HEMT using the InGaAs layer having a constant In composition as a pseudomorphic layer is shown in FIG. 4. FIG. 5 shows the In composition distribution in this case.

According to the embodiment, the InGaAs layer 8 as a pseudomorphic layer has been formed as a graded layer whose In composition linearly continuously changes from the undoped GaAs layer 2 toward the n-type AlGaAs layer 3. Therefore, while in the conventional HEMT using the InGaAs layer having a constant In composition as a pseudomorphic layer as shown in FIGS. 4 and 5, the thickness of InGaAs layer needs to be set to a small value of about 200 to 150 Å due to limitation by the critical layer thickness, in the case of the embodiment, the thickness of InGaAs layer 8 can be set to a large value of, e.g., about 300 Å. As a result, the controllability of the thickness of the InGaAs layer 8 is better than that in the conventional device. On the other hand, in the case of growing the InGaAs layer 8 by MBE after the undoped GaAs layer 2 was grown, there is no need to suddenly lower the growth temperature as in the conventional device and it is sufficient to slowly reduce the growth temperature as compared with the conventional one.

Further, since the junction between the InGaAs layer 8 and the undoped GaAs layer 2 is constructed as a homojunction instead of a heterojunction, only a single heterojunction between the n-type AlGaAs layer 3 and the InGaAs layer 8 exists in the HEMT according to the embodiment. Therefore, since it becomes difficult to be influenced by the alloy clusters and the like as compared with the conventional device, the deterioration in characteristics of the HEMT due to this can be prevented.

As mentioned above, according to the embodiment, the HEMT in which the 2DEG concentration $n_s$ is high and the characteristics are good can be realized and it can be also more easily fabricated as compared with the conventional one.

In the above embodiment, the In composition of the InGaAs layer 8 has linearly been changed. However, it is possible to use any In composition distribution such that the In composition monotonically increases from the undoped GaAs layer 2 toward the n-type AlGaAs layer 3. Practically speaking, for instance the distribution curve of the In composition can be set to be upwardly convex or concave. In this case, the thickness of InGaAs layer 8 is determined in accordance with the distribution curve of the In composition. For instance, when the distribution curve of the In composition is upwardly convex, the inclination of the energy band of the InGaAs layer 8 is large. Therefore, there is an advantage such that a short channel effect can be effectively suppressed as compared with the n-type AlGaAs/GaAs HEMT using no InGaAs layer, which also has a single heterojunction.

On the other hand, in the above embodiment, the In composition of the InGaAs layer 8 at the interface with the n-type AlGaAs layer 3 has been set to 20%. However, the In composition can be also obviously set to a value other than 20%. In this case, it is possible to have the degree of freedom in changing the desired band shape of the InGaAs layer 8 for improving the characteristics of the HEMT. Further, the undoped GaAs layer 2, the InGaAs layer 8, the n-type AlGaAs layer 3, and the n-type GaAs layer 4 can be also grown by using a method other than MBE, for instance, metalorganic chemical vapor deposition (MOCVD).

The present invention can be also applied to the so-called inverted HEMT in which the stacking order of the undoped GaAs layer 2 and the n-type AlGaAs layer 3 is opposite to that in FIG. 1. Further, the present invention is not limited to only the n-type AlGaAs/InGaAs/GaAs HEMT as in the above embodiment but can be also applied to HEMTs using various semiconductor heterojunction such as an n-type InGaP/InGaAs/GaAs HEMT and the like.

As described above, according to the present invention, since the channel layer near the interface between the channel layer and the electron supply layer is formed as a graded layer, it is possible to realize a compound semiconductor device which has good characteristics and which can be easily fabricated. Further, the energy band shape of the graded layer can be made to the desired shape by controlling the compositions of the graded layer.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A compound semiconductor device comprising a semiconductor layer of undoped GaAs, a graded channel layer of InGaAs formed on said semiconductor layer, an n-type electron supply layer of n-type AlGaAs formed on said graded channel layer, said graded channel layer has a thickness of about 300 Angstroms and wherein the In composition of said graded channel layer varies from zero per cent adjacent said GaAs layer to about 20 per cent adjacent said n-type AlGaAs layer.

* * * * *